United States Patent
Liao

(10) Patent No.: US 9,455,319 B2
(45) Date of Patent: Sep. 27, 2016

(54) SEMICONDUCTOR DEVICE

(71) Applicant: UNITED MICROELECTRONICS CORP., Hsinchu (TW)

(72) Inventor: Wei-Shan Liao, Yunlin County (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 47 days.

(21) Appl. No.: 14/275,218

(22) Filed: May 12, 2014

(65) Prior Publication Data

US 2015/0325639 A1 Nov. 12, 2015

(51) Int. Cl.
*H01L 21/8238* (2006.01)
*H01L 29/10* (2006.01)
*H01L 29/06* (2006.01)
*H01L 29/78* (2006.01)
*H03K 17/687* (2006.01)
*H01L 29/417* (2006.01)
*H01L 29/66* (2006.01)
*H01L 21/761* (2006.01)
H01L 29/423 (2006.01)

(52) U.S. Cl.
CPC ......... *H01L 29/1095* (2013.01); *H01L 21/761* (2013.01); *H01L 29/0619* (2013.01); *H01L 29/0692* (2013.01); *H01L 29/0696* (2013.01); *H01L 29/41758* (2013.01); *H01L 29/66659* (2013.01); *H01L 29/7816* (2013.01); *H01L 29/7835* (2013.01); *H03K 17/687* (2013.01); H01L 29/0638 (2013.01); H01L 29/1083 (2013.01); H01L 29/1087 (2013.01); H01L 29/42368 (2013.01)

(58) Field of Classification Search
CPC .......... H01L 29/0619; H01L 29/1095; H01L 29/7816; H01L 29/7833; H01L 29/7835
See application file for complete search history.

(56) References Cited

U.S. PATENT DOCUMENTS

| 5,146,298 A * | 9/1992 | Eklund | ............... H01L 29/0634 257/273 |
|---|---|---|---|
| 8,138,570 B2 | 3/2012 | Williams et al. | |
| 8,482,063 B2 | 7/2013 | Lin et al. | |
| 2013/0278301 A1* | 10/2013 | Huynh | ................ H01L 27/0255 327/110 |

OTHER PUBLICATIONS

U.S. Appl. No. 14/136,113, Inventor: Wei-Shan Liao, filed Dec. 20, 2013.

* cited by examiner

*Primary Examiner* — Thanh Y Tran
(74) *Attorney, Agent, or Firm* — WPAT, PC; Justin King

(57) ABSTRACT

A semiconductor device and an operating method of the same are disclosed. The semiconductor device includes a substrate, a source region, a drain region, a gate structure, a first lightly-doped region, and a first isolation region. The source region and the drain region are formed in the substrate. The gate structure is formed on the substrate and between the source region and the drain region. The first lightly-doped region is formed below the source region. The first isolation region is formed in the substrate and surrounding the source region, the drain region, and the first lightly-doped region. The source region and the drain region have a first-polarity, and the first lightly-doped region and the first isolation region have a second-polarity.

18 Claims, 5 Drawing Sheets

SEMICONDUCTOR DEVICE

BACKGROUND

1. Technical Field

The disclosure relates in general to a semiconductor device and an operating method thereof, and more particularly to a semiconductor device capable of performing a positive voltage operation and a negative voltage operation and an operating method thereof.

2. Description of the Related Art

Recently, along with the research and developments of semiconductor devices, the demands of high voltage semiconductor devices have rapidly increased. For example, metal oxide semiconductors, such as a lateral diffused MOSFET transistor (LDMOS), capable of withstanding a high voltage have drawn a lot of attention.

However, the manufacturing process as well as the structure of a LDMOS is critical to its operations and functions. Therefore, there is always a continuing need to provide an improved high voltage semiconductor device as well as the manufacturing process thereof.

SUMMARY OF THE INVENTION

The disclosure is directed to a semiconductor device and an operating method thereof. According to some embodiments of the present disclosure, the first lightly-doped region is formed below the source region, such that it can stop the lightly-doped region having a different polarity from that of the first lightly-doped region from expanding too much causing punch through between the lightly-doped region and the source region.

According to an embodiment of the present disclosure, a semiconductor device is disclosed. The semiconductor device includes a substrate, a source region, a drain region, a gate structure, a first lightly-doped region, and a first isolation region. The source region and the drain region are formed in the substrate. The gate structure is formed on the substrate and between the source region and the drain region. The first lightly-doped region is formed below the source region. The first isolation region is formed in the substrate and surrounding the source region, the drain region, and the first lightly-doped region. The source region and the drain region have a first-polarity, and the first lightly-doped region and the first isolation region have a second-polarity.

According to another embodiment of the present disclosure, an operating method of a semiconductor device is disclosed. The operating method includes the following steps: providing the semiconductor device, which comprises a substrate, a source region, a drain region having a first voltage, a gate structure, a first lightly-doped region, an isolation doped region having a second voltage, and a doped region; applying a positive voltage to the gate structure when the first voltage is equal to the second voltage, and the source region and the doped region are grounded; and applying a negative voltage to the gate structure when the first voltage is different from the second voltage, the source region has a negative voltage, and the doped region is grounded. The source region and the drain region are formed in the substrate, and the gate structure is formed on the substrate and between the source region and the drain region. The first lightly-doped region is formed below the source region, and the isolation doped region is formed in the substrate and surrounding the source region, the drain region, and the first lightly-doped region. The doped region is formed in the substrate and located outside the isolation doped region. The source region and the drain region have a first-polarity, and the first lightly-doped region the isolation doped region, and the doped region have a second-polarity The disclosure will become apparent from the following detailed description of the preferred but non-limiting embodiments. The following description is made with reference to the accompanying drawings.

DETAILED DESCRIPTION OF THE INVENTION

Figure 1A:
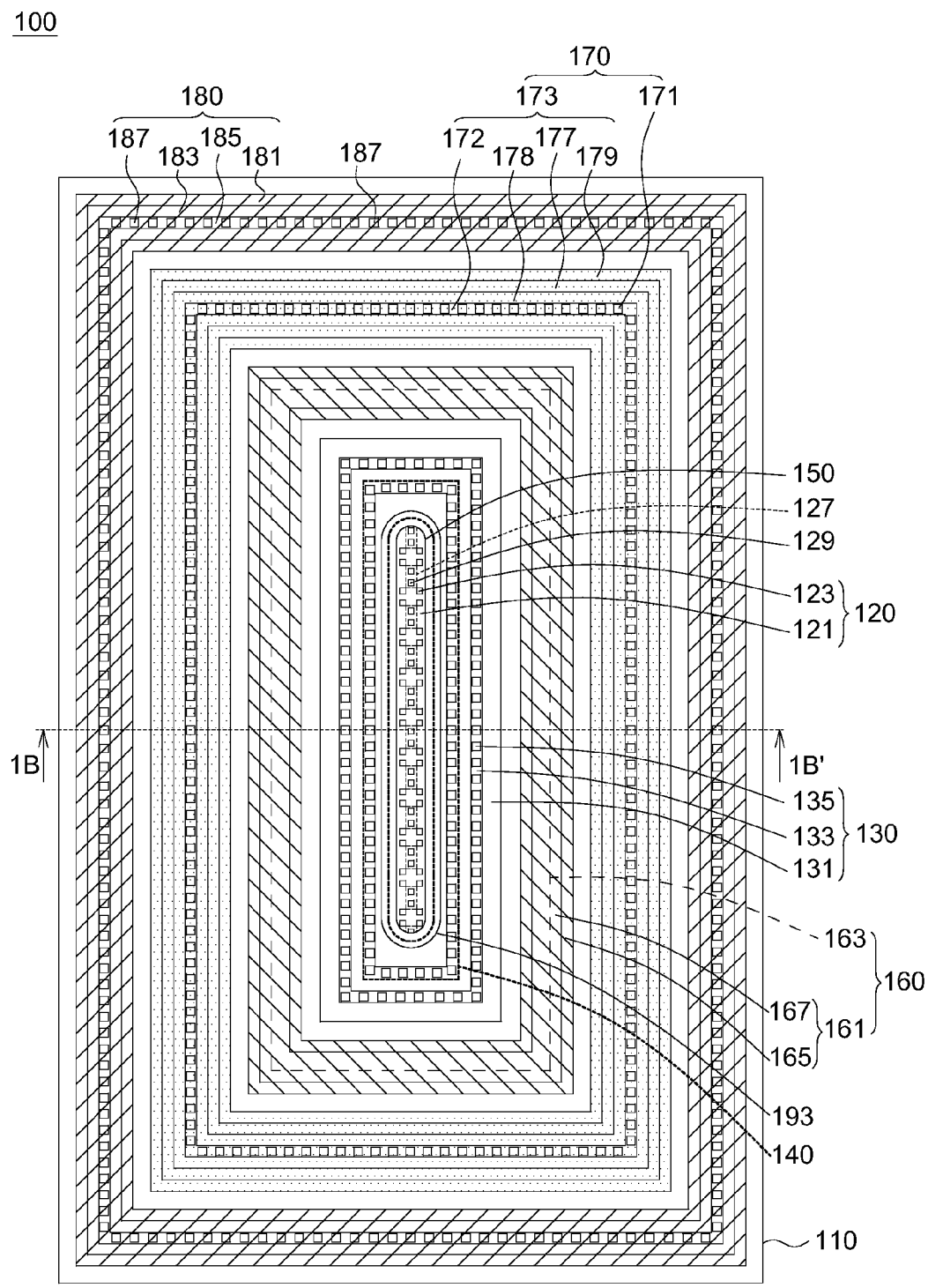
FIG. 1A shows a top view of a semiconductor device according to an embodiment of the present disclosure.

In some embodiments of the present disclosure, in the semiconductor device, the first lightly-doped region is formed below the source region, such that it can stop the lightly-doped region having a different polarity from that of the first lightly-doped region from expanding too much causing punch through between the lightly-doped region and the source region. The embodiments are described in details with reference to the accompanying drawings. The procedures and details of the method of the embodiments are for exemplification only, not for limiting the scope of protection of the disclosure. Moreover, the identical elements of the embodiments are designated with the same reference numerals. Also, it is also important to point out that the illustrations may not be necessarily be drawn to scale, and that there may be other embodiments of the present disclosure which are not specifically illustrated. Thus, the specification and the drawings are to be regard as an illustrative sense rather than a restrictive sense.

Figure 1B:
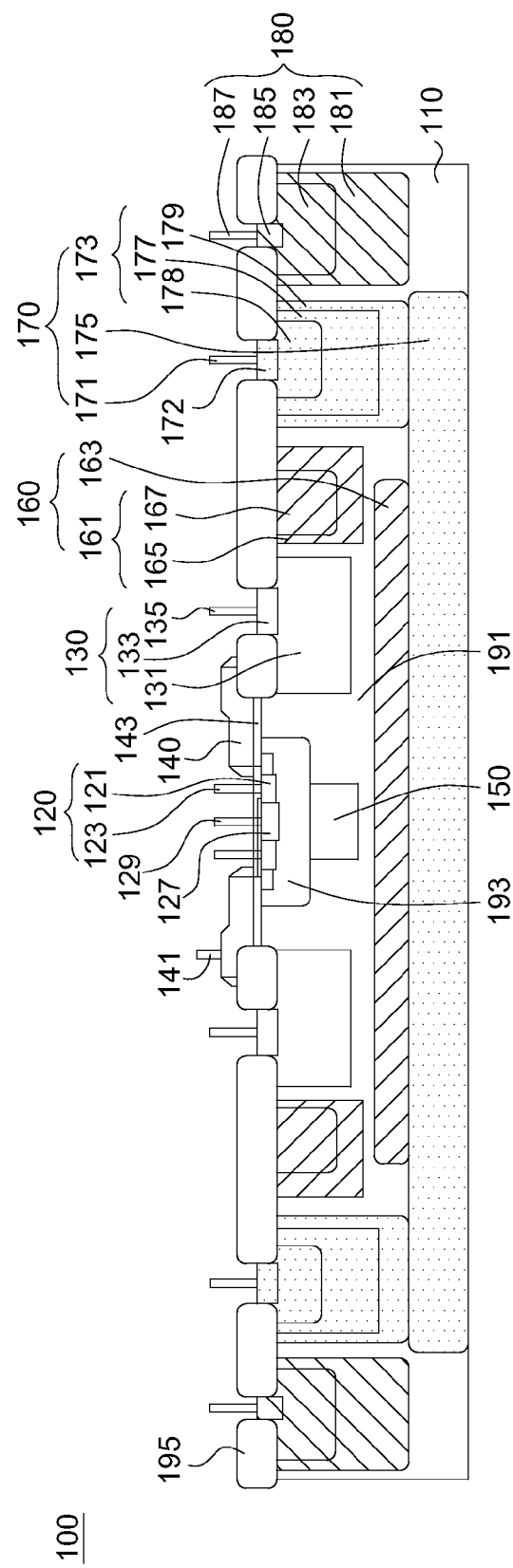
FIG. 1B shows a cross-sectional view along the section line 1B-1B' in FIG. 1A.

FIG. 1A shows a top view of a semiconductor device 100 according to an embodiment of the present disclosure, and FIG. 1B shows a cross-sectional view along the section line 1B-1B' in FIG. 1A. Referring to FIGS. 1A-1B, the semiconductor device 100 includes a substrate 110, a source region 120, a drain region 130, a gate structure 140, a first lightly-doped region 150, and a first isolation region 160. The source region 120 and the drain region 130 are formed in the substrate 110. The gate structure 140 is formed on the substrate 110 and between the source region 120 and the drain region 130. The first lightly-doped region 150 is formed below the source region 120. The first isolation region 160 is formed in the substrate 110 and surrounding the source region 120, the drain region 130, and the first lightly-doped region 150. The source region 120 and the drain region 130 have a first-polarity, and the first lightly-doped region 150 and the first isolation region 160 have a second-polarity. In the embodiment, the first lightly-doped region 150 is such as a high voltage P-type lightly-doped region (HV_PLDD), In the embodiment, the substrate 110 has the second-polarity. That is, the substrate 110, the first lightly-doped region 150, and the first isolation region 160 have the same type of polarity. In the embodiment, the substrate 110 is such as a P-substrate.

In an embodiment, the first polarity is N-type, and the second-polarity is P-type. In an alternative embodiment, the first polarity may be P-type, and the second-polarity may be N-type.

As shown in FIG. 1B, the semiconductor device 100 may further include a high voltage well region 191. The high voltage well region 191 having the second-polarity is formed in the substrate 110. The source region 120, the drain region 130, the first lightly-doped region 150, and the first isolation region 160 are formed in the high voltage well region 191. Compared to the above regions 120, 130, 150, and 160, the dopant concentration of the high voltage well region 191 is the lowest, of which the dopant concentration is in the scale level of $10^{12}$ cm$^{-2}$. In the embodiment, the high voltage well region 191 is such as a high voltage P well (HVPW).

As shown in FIGS. 1A-1B, the first isolation region 160 may include a first doped ring structure 161 and a first buried layer 163. The first doped ring structure 161 is formed in the substrate 110. The first buried layer 163 is formed in the substrate 110 and adjacent to the bottom of the first doped ring structure 161. In the embodiment, the first doped ring structure 161 has a race-track structure for providing a uniform dopant concentration, and the first buried layer 163 is a planar layer covering the source region 120 and the drain region 130. In the embodiment, the first buried layer 163 is such as a P-type buried layer (PBL), and the dopant concentration of the first buried layer 163 is higher than that of the first doped ring structure 161. In the embodiment, the dopant concentration of the first buried layer 163 is in the scale level of $10^{13}$ cm$^{-2}$, and the dopant concentration of the first doped ring structure 161 is in the scale level of $10^{12}$ cm$^{-2}$.

In the embodiment, the first doped ring structure 161 may include a first high voltage lightly-doped region 165 and a first well region 167. As shown in FIG. 1B, the first well region 167 is formed in the first high voltage lightly-doped region 165 and has a dopant concentration higher than that of the first high voltage lightly-doped region 165. In the embodiment, the first high voltage lightly-doped region 165 is such as a high voltage P-type lightly-doped region (HV_PLDD), and the first well region 167 is such as a P well (PW).

As shown in FIGS. 1A-1B, the semiconductor device 100 may further include a second isolation region 170. The second isolation region 170 is formed in the substrate 110 and surrounding the first isolation region 160, and the second isolation region 170 has the first-polarity.

In the embodiment, as shown in FIG. 1B, the second isolation region 170 may include a connecting pin 171 for receiving an individual voltage.

In the embodiment, the second isolation region 170 may include a second doped ring structure 173 and a second buried layer 175. The second doped ring structure 173 is formed in the substrate 110. The second buried layer 175 is formed in the substrate 110 and adjacent to the bottom of the second doped ring structure 173. As shown in FIGS. 1A-1B, the second doped ring structure 173 has a race-track structure and is in contact with the second buried layer 175 for enclosing the regions 120, 130, 150, and 160 therewithin. The second buried layer 175 is a planar layer covering the source region 120, the drain region 130, and the first isolation region 160. In the embodiment, the second buried layer 175 is such as an N-type buried layer (NBL), and the dopant concentration of the second buried layer 175 is higher than that of the second doped ring structure 173. In the embodiment, the dopant concentration of the second buried layer 175 is in the scale level of $10^{14}$ cm$^{-2}$, and the dopant concentration of the second doped ring structure 173 is in the scale level of $10^{12}$ cm$^{-2}$.

In the embodiment, the second doped ring structure 173 may include a heavily-doped region 172, a second high voltage lightly-doped region 177, a second well region 178, and a deep well region 179. The heavily-doped region 172 is formed in the second well region 178 and connected to the connecting pin 171. The second well region 178 is formed in the second high voltage lightly-doped region 177 and has a dopant concentration higher than that of the second high voltage lightly-doped region 177. The deep well region 179 is in contact with the second buried layer 175. The second well region 178 and the second high voltage lightly-doped region 177 are formed in the deep well region 179. In the embodiment, the heavily-doped region 172 is such as a heavily N-doped region (N+), the high voltage lightly-doped region 177 is such as a high voltage lightly N-doped region (HV_NLDD), the second well region 178 is such as an N well (NW), and the deep well region 179 is such as a high voltage deep N well (HVDNW). In the embodiment, the dopant concentration of the second well region 178 is higher than that of the second high voltage lightly-doped region 177, which is higher than the dopant concentration of the deep well region 179.

In the embodiments, since the high voltage well region 191 has a relatively low dopant concentration for high voltage operation; accordingly, punch through may as well occur between the drain region 130 and the second isolation region 170, since a voltage difference is generated between the drain region 130 and the second isolation region 170 when the semiconductor device 100 is in a negative voltage operation, which will be discussed later. In the embodiments of the present disclosure, the first isolation region 160 having a higher dopant concentration than that of the high voltage well region 191 and enclosing the drain region 130 can effectively prevent the punch through between the drain region 130 and the second isolation region 170. Particularly, the first buried layer 163 prevents the vertical punch through, and the first doped ring structure 161 prevents the lateral punch through.

As shown in FIGS. 1A-1B, the semiconductor device 100 may further include a third doped ring structure 180. In the embodiment, the third doped ring structure 180 has a race-track structure. The third doped ring structure 180 having the second-polarity is formed in the substrate 110 and located outside the second isolation region 170. The third doped ring structure 180 and the substrate 110 are equipotential. In the embodiment, the third doped ring structure 180 may include a high voltage well region 181 and a third well region 183. The high voltage well region 181 is formed in the substrate 110, and the third well region 183 is formed in the high voltage well region 181. The third doped ring structure 180 may further include a heavily-doped region 185 formed in the third well region 183 and a contact 187 connected to the heavily-doped region 185. In the embodiment, the high voltage well region 181 is such as a high voltage P well (HVPW), the third well region 183 is such as a P well (PW), and the heavily-doped region 185 is such as a heavily P-doped region (P+).

The high voltage well region 191 has a relatively low dopant concentration for high voltage operation; accordingly, punch through may occur between the substrate 110 and the source region 120, since a voltage difference, for example, of 12 V, is generated between the substrate 110 and the source region 120 when the semiconductor device 100 is in a negative voltage operation, which will be discussed later. In the embodiments of the present disclosure, the second isolation region 170 having a higher dopant concentration than that of the high voltage well region 191 and enclosing the source region 120 can effectively prevent the punch through between the source region 120 and the substrate 110. Particularly, the second buried layer 175 prevents the vertical punch through, and the second doped ring structure 173 prevents the lateral punch through.

As shown in FIGS. 1A-1B, the source region 120 may include a heavily-doped region 121 having the first-polarity and a source contact 123 connected to the heavily-doped region 121. In the embodiment, the heavily-doped region 121 is such a heavily N-doped region (N+). In the embodiment, the semiconductor device 100 may include a heavily-doped region 127 having the second-polarity and a contact 129 connected to the heavily-doped region 127, and the heavily-doped region 127 is formed in the heavily-doped region 121. In the embodiment, the heavily-doped region 127 is such as a heavily P-doped region (P+), and the contact 129 serves as a body contact. In the embodiment, the heavily-doped region 121 and the heavily-doped region 127 are electrically connected through, for example, a metal line, and the two regions 121, 127 are equipotential.

In the embodiment, as shown in FIGS. 1A-1B, the semiconductor device 100 may further include a doped region 193 having the second-polarity formed in the substrate 110, wherein the heavily-doped region 121 and the heavily-doped region 127 are formed in the doped region 193. In the embodiment, the doped region 193 is such as a P-base.

As shown in FIGS. 1A-1B, the drain region 130 may include a third high voltage lightly-doped region 131 and a first heavily-doped region 133. The first heavily-doped region 133 formed in the third high voltage lightly-doped region 131 and has a dopant concentration higher than that of the third high voltage lightly-doped region 131. The drain region 130 may further include a drain contact 135 connected to the first heavily-doped region 133. In the embodiment, the third high voltage lightly-doped region 131 is such as a high voltage lightly N-doped region (HV_NLDD), and the first heavily-doped region 133 is such as a heavily N-doped region (N+). The lightly-doped region 133 may serve as a channel of the device and lowers the resistance of the heavily-doped region 133.

Moreover, the third high voltage lightly-doped region 131 has a race-track structure, which provides a uniform distribution of the dopant concentration. Besides, the heavily-doped region 133 is protected by the third high voltage lightly-doped region 131 from electrically contacting the high voltage well region 191, and accordingly a decrease of the breakdown voltage of the semiconductor device 100 is further prevented.

In the embodiment, the lightly-doped region 131 may diffuse and expand toward the source region 120 after a thermal treatment. The first lightly-doped region 150 formed below the source region 120 may diffuse and expand toward the drain region 130 after a thermal treatment as well. Accordingly, the expanded first lightly-doped region 150 can stop the lightly-doped region 131 from expanding too much causing punch through between the lightly-doped region 131 and the heavily-doped region 121 of the source region 120. In other words, the first lightly-doped region 150 formed below the source region 120 can prevent the punch through between the source region 120 and the drain region 130.

As shown in FIG. 1B, the source region 120, the drain region 130, the first isolation region 160, the second isolation region 170, and the doped ring structure 180 are separated by isolation structures 195. In the embodiment, the isolation structures 195 are such as field oxides (FOX).

Figure 2A:
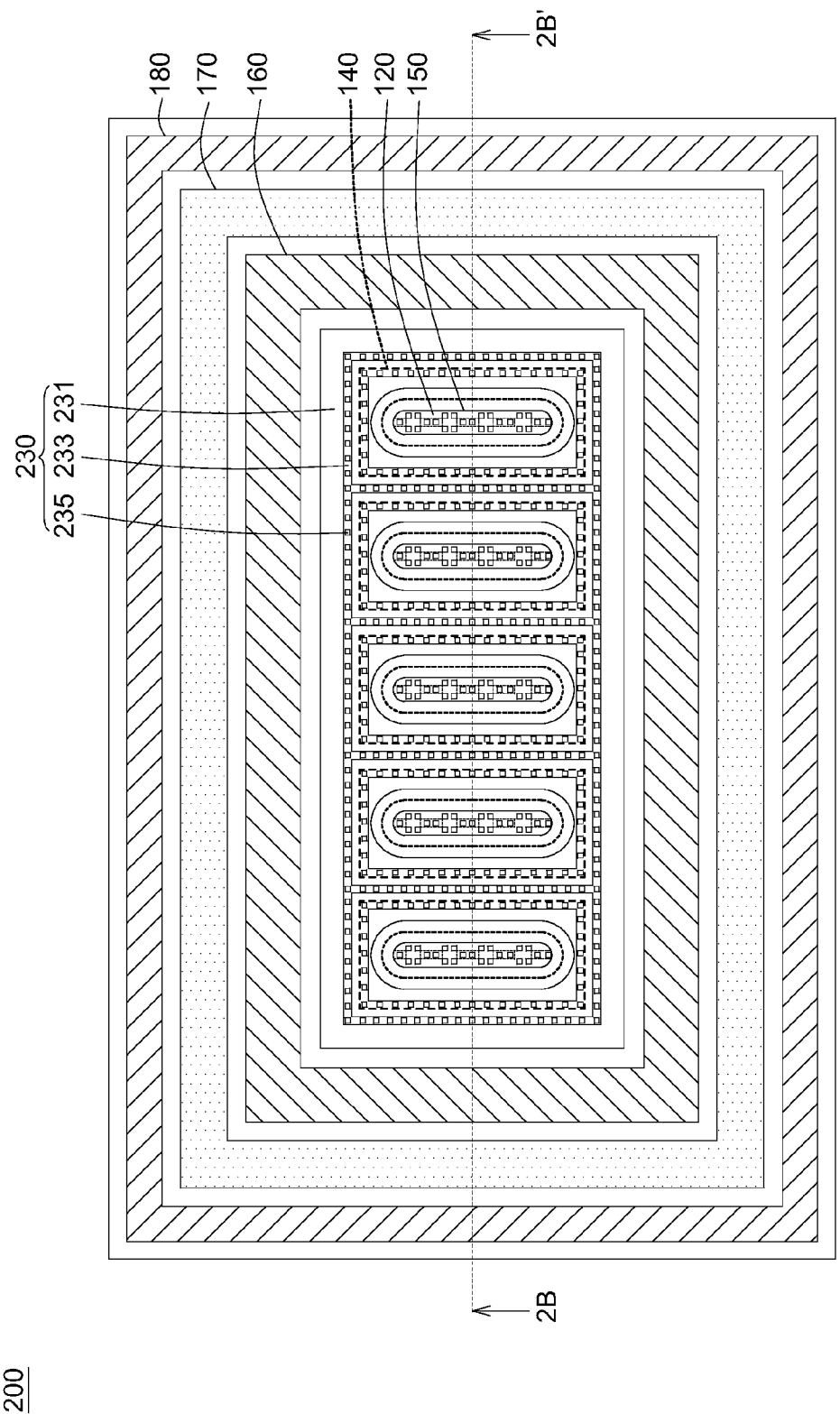
FIG. 2A shows a top view of a semiconductor device according to another embodiment of the present disclosure.
Figure 2B:
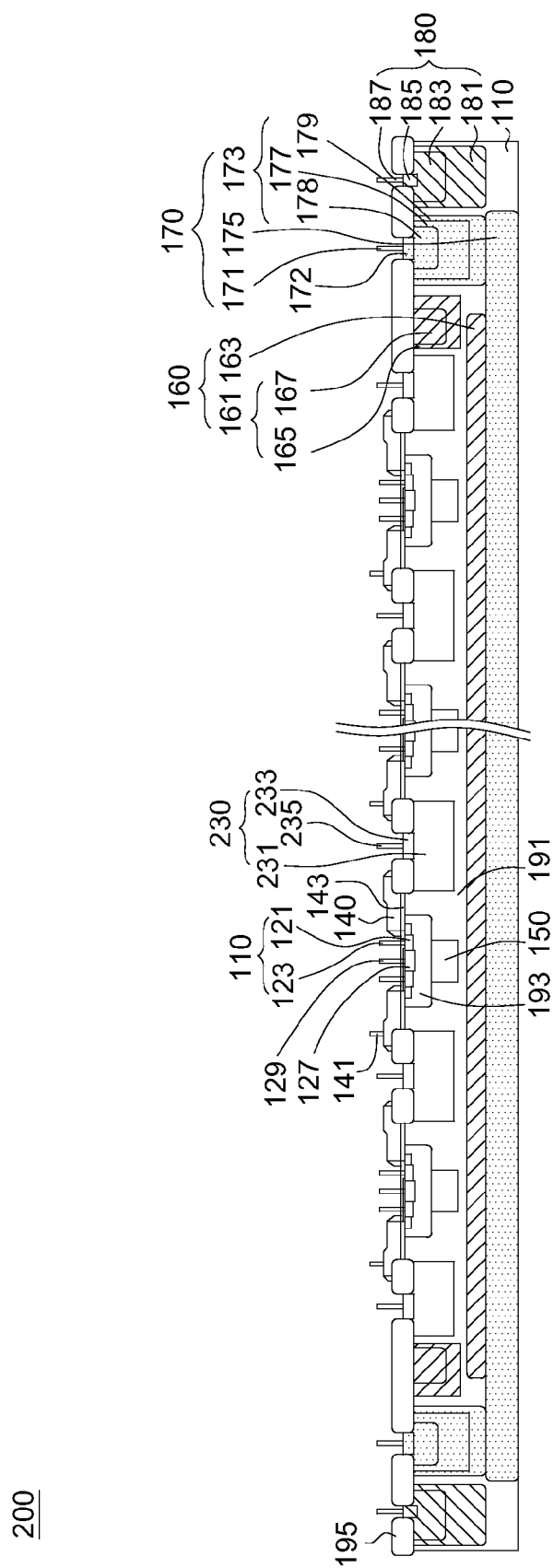
FIG. 2B shows a cross-sectional view along the section line 2B-2B' in FIG. 2A.

FIG. 2A shows a top view of a semiconductor device 200 according to another embodiment of the present disclosure, and FIG. 2B shows a cross-sectional view along the section line 2B-2B' in FIG. 2A. The elements in the present embodiment sharing the same labels with those in the previous embodiment are the same elements, and the description of which is omitted.

As shown in FIGS. 2A-2B, the semiconductor device 200 includes a plurality of the source regions 120, a plurality of the gate structures 140, and a plurality of the first lightly-doped regions 150, wherein one of each may form a repeating unit. As shown in FIG. 2B, the semiconductor device 200 includes a drain region 230, which corresponds to a plurality of the above-mentioned repeating units. These repeating units of the source regions 120, the gate structures 140, and the first lightly-doped regions 150 are arranged in an array, such that the power output of the semiconductor device 200 is greater than that of the semiconductor device 100 having only one set of the source region 120, the gate structure 140, and the first lightly-doped region 150.

The followings are for elaborating a manufacturing method of the semiconductor device 100 of the disclosure. However, the descriptions disclosed in the embodiments of the disclosure such as detailed manufacturing procedures are for illustration only, not for limiting the scope of protection of the disclosure.

Referring to FIGS. 1A-1B, at first, the substrate (e.g. P-substrate) 110 is provided. Next, the buried layer 175 (e.g. NBL) is defined and formed in the substrate 110, followed by a thermal treatment. And then, the buried layer 163 (e.g. PBL) is defined and formed in the substrate 110. Next, after an epitaxial process is performed for finishing up the substrate 110, the high voltage well region 181 (e.g. HVPW), the deep well region 179 (e.g. HVDNW), and the high voltage well region 191 (e.g. HVPW) are formed in the substrate 110, followed by another thermal treatment. And then, the first well region 167 (e.g. PW), the second well region 178 (e.g. NW), and the third well region 183 (e.g. PW) are formed in the substrate 110.

Next, active regions are defined, and then the first lightly-doped region 150 (e.g. HV_PLDD), the third high voltage lightly-doped region 131 (e.g. HV_NLDD), the first high voltage lightly-doped region 165 (e.g. HV_PLDD), and the high voltage lightly-doped region 177 (e.g. HV_NLDD) are formed in the substrate 110, followed by the formation of the isolation structures 195 (e.g. FOX) and a further thermal treatment. And then, the doped region 193 (e.g. P-base), gate oxides 143, the gate structure 140, the heavily-doped region 121 (e.g. N+), the heavily-doped region 127 (e.g. P+), the first heavily-doped region 133 (e.g. N+), the heavily-doped region 172 (e.g. N+), and the heavily-doped region 185 (e.g. P+) are formed in the above-mentioned doped regions. Next, contacts 123, 129, 135, 141, and 187, which are connected to the above-mentioned heavily-doped regions, are formed, and then metal lines connected to the contacts 123, 129, 135, 141, and 187 are formed. As such, the semiconductor device 100 according to the embodiments of the present disclosure is formed.

In the embodiments, the first lightly-doped region 150 and the third high voltage lightly-doped region 131 are formed in the same manufacturing process, such that these two regions may diffuse and expand simultaneously in the following thermal process, and the first lightly-doped region 150 can prevent the third high voltage lightly-doped region 131 from expanding too much causing punch through between the lightly-doped region 131 and the heavily-doped region 121.

In an embodiment, an operating method of the semiconductor device according to the embodiments of the present disclosure is provided. Referring to FIGS. 1A-1B, in addition to the contacts 123, 135, 141, and 187 respectively connected to the source region 120, the drain region 130, the gate structure 140, and the doped ring structure 180, the individual connecting pin 171 of the second isolation region 170 can receive an individual voltage, which is applied independently from other voltages applied to the source region 120, the drain region 130, the gate structure 140, and the doped ring structure 180. As such, the semiconductor device of the present disclosure can be operated in two different modes.

When the voltage Vd applied to the drain region 130 is equal to the voltage Viso-d applied to the second isolation region 170, and the source region 120 and the doped region (doped ring structure 180) are grounded, a positive voltage can be applied to the gate structure 140. In such case, the semiconductor device performs a positive voltage operation.

When the voltage Vd applied to the drain region 130 is different from the voltage Viso-d applied to the second isolation region 170, the source region 120 has a negative voltage, and the doped region (doped ring structure 180) is grounded, a negative voltage can be applied to the gate structure 140. In such case, the semiconductor device performs a negative voltage operation.

Figure 3A:
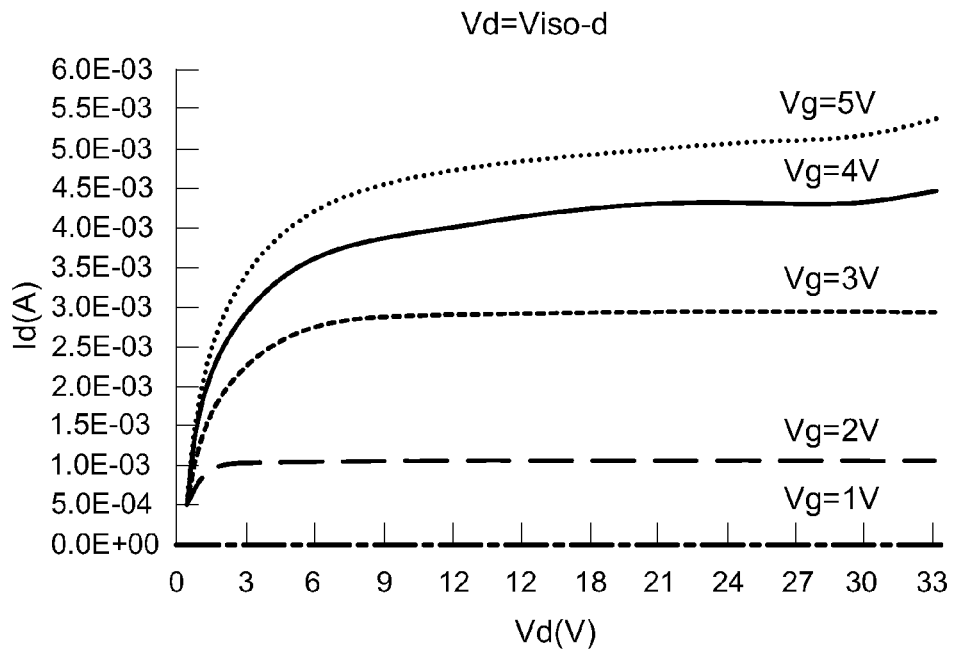
FIGS. 3A-3B show I-V curves of a semiconductor device according to the embodiments of the present disclosure under positive voltage operation and negative voltage operation, respectively.
Figure 3B:
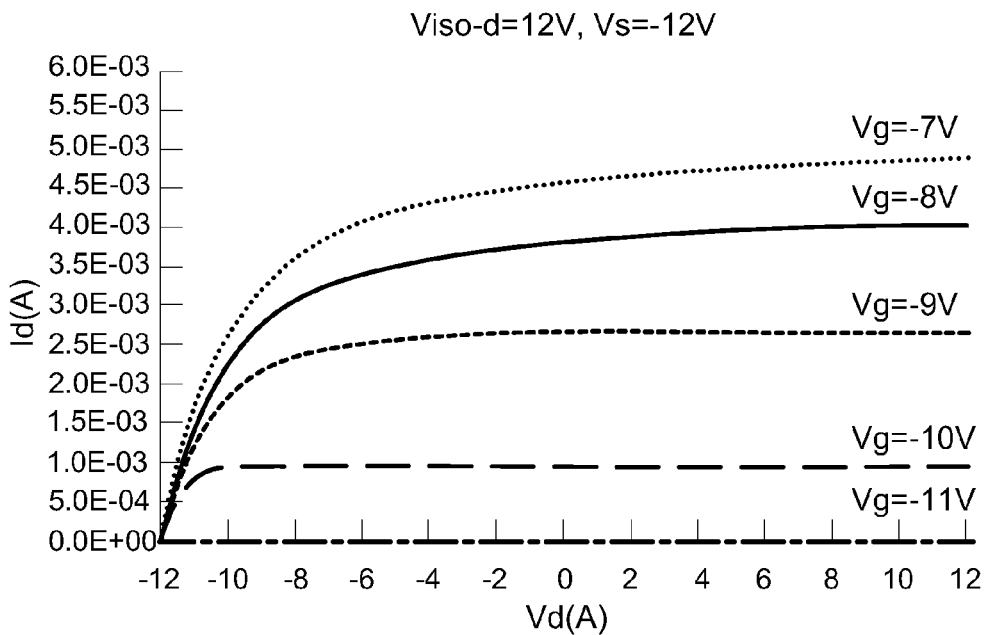

FIGS. 3A-3B show I-V curves of a semiconductor device according to the embodiments of the present disclosure under positive voltage operations and negative voltage operations, respectively. As shown in FIG. 3A, in the embodiment, while the voltage Vd applied to the drain region 130 and the voltage Viso-d applied to the second isolation region 170 are equipotential, the semiconductor device can perform a positive voltage operation, and the I-V curves are nicely shown in FIG. 3A. In the positive voltage operation mode, the voltage Vg applied to the gate structure 140 is about 1V to 5V, and the drain voltage Vd is about 0 to 33 V. As shown in FIG. 3B, in the embodiment, while the voltage Vd applied to the drain region 130 is different from the voltage Viso-d applied to the second isolation region 170, the semiconductor device can perform a negative voltage operation, and the I-V curves are nicely shown in FIG. 3B. In the negative voltage operation mode, the voltage Vg applied to the gate structure 140 is about −7 V to −11 V, the drain voltage Vd is about −12 V to 12 V, the voltage Viso-d applied to the second isolation region 170 is about 12 V, and the negative voltage Vs of the source region 120 is about −12 V.

In summary, the second isolation region 170 can receive an individual voltage, which is applied independently from other voltages applied to the other regions; therefore, the semiconductor device according to the embodiments of the present disclose can perform a positive voltage operation and a negative voltage operation.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor device, comprising:
   a substrate;
   a source region and a drain region formed in the substrate;
   a gate structure formed on the substrate and between the source region and the drain region;
   a first lightly-doped region formed below the source region, wherein a top surface of the first lightly-doped region is below a bottom surface of the source region; and
   a first isolation region formed in the substrate and surrounding the source region, the drain region, and the first lightly-doped region;
   wherein the source region and the drain region have a first-polarity, and the first lightly-doped region and the first isolation region have a second-polarity.

2. The semiconductor device according to claim 1, wherein the first-polarity is N-type, and the second-polarity is P-type.

3. The semiconductor device according to claim 1, wherein the substrate has the second-polarity.

4. The semiconductor device according to claim 1, wherein the first isolation region comprises:
   a first doped ring structure formed in the substrate; and
   a first buried layer formed in the substrate and adjacent to the bottom of the first doped ring structure.

5. The semiconductor device according to claim 4, wherein the first doped ring structure comprises:
   a first high voltage lightly-doped region; and
   a first well region formed in the first high voltage lightly-doped region and having a dopant concentration higher than that of the first high voltage lightly-doped region.

6. The semiconductor device according to claim 1, further comprising:
   a second isolation region formed in the substrate and surrounding the first isolation region, wherein the second isolation region has the first-polarity.

7. The semiconductor device according to claim 6, wherein the second isolation region comprises a connecting pin for receiving an individual voltage.

8. The semiconductor device according to claim 6, wherein the second isolation region comprises:
   a second doped ring structure formed in the substrate; and
   a second buried layer formed in the substrate and adjacent to the bottom of the second doped ring structure.

9. The semiconductor device according to claim 8, wherein the second doped ring structure comprises:
   a second high voltage lightly-doped region; and
   a second well region formed in the second high voltage lightly-doped region and having a dopant concentration higher than that of the second high voltage lightly-doped region.

10. The semiconductor device according to claim 9, wherein the second doped ring structure further comprises:
    a deep well region in contact with the second buried layer, wherein the second well region and the second high voltage lightly-doped region are formed in the deep well region.

11. The semiconductor device according to claim 1, further comprising:
    a third doped ring structure having the second-polarity formed in the substrate and located outside the second isolation region, comprising:

a high voltage well region formed in the substrate; and
a third well region formed in the high voltage well region.

12. The semiconductor device according to claim 1, wherein the drain region comprises:
a third high voltage lightly-doped region; and
a first heavily-doped region formed in the third high voltage lightly-doped region and having a dopant concentration higher than that of the third high voltage lightly-doped region.

13. An operating method of a semiconductor device, comprising:
providing the semiconductor device, wherein the semiconductor device comprises:
a substrate;
a source region and a drain region formed in the substrate, the drain region having a first voltage;
a gate structure formed on the substrate and between the source region and the drain region;
a first lightly-doped region formed below the source region;
an isolation doped region formed in the substrate and surrounding the source region, the drain region, and the first lightly-doped region, the isolation doped region having a second voltage; and
a doped region formed in the substrate and located outside the isolation doped region, wherein the source region and the drain region have a first-polarity, and the first lightly-doped region, the isolation doped region and the doped region have a second-polarity;
applying a positive voltage to the gate structure when the first voltage is equal to the second voltage, and the source region and the doped region are grounded; and
applying a negative voltage to the gate structure when the first voltage is different from the second voltage, the source region has a negative voltage, and the doped region is grounded.

14. The operating method according to claim 13, wherein the positive voltage applying to the gate structure is about 1 V to 5 V.

15. The operating method according to claim 13, wherein when the first voltage is equal to the second voltage, the first voltage is about 0 to 33 V.

16. The operating method according to claim 13, wherein the negative voltage applying to the gate structure is about −7 V to −11 V.

17. The operating method according to claim 13, wherein when the first voltage is different from the second voltage, the first voltage is about −12 V to 12 V.

18. The operating method according to claim 13, wherein when the first voltage is different from the second voltage, the second voltage is about 12 V, and the negative voltage of the source region is about −12 V.

* * * * *